(12) United States Patent
Chen

(10) Patent No.: US 11,404,240 B2
(45) Date of Patent: Aug. 2, 2022

(54) INSPECTION DEVICES AND METHODS OF INSPECTING A SAMPLE

(71) Applicant: GLOBALFOUNDRIES Singapore Pte. Ltd., Singapore (SG)

(72) Inventor: Changqing Chen, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/130,002

(22) Filed: Dec. 22, 2020

(65) Prior Publication Data

US 2022/0199359 A1    Jun. 23, 2022

(51) Int. Cl.
*H01J 37/22*  (2006.01)
*H01J 37/244* (2006.01)
*H01J 37/28*  (2006.01)

(52) U.S. Cl.
CPC .......... *H01J 37/228* (2013.01); *H01J 37/244* (2013.01); *H01J 37/28* (2013.01); *H01J 2237/24564* (2013.01); *H01J 2237/2817* (2013.01)

(58) Field of Classification Search
CPC .. H01J 37/00; H01J 37/02; H01J 37/28; H01J 37/228; H01J 37/244; H01J 37/22; H01J 37/226; H01J 37/24; H01J 37/241; H01J 37/26; H01J 37/252; H01J 2237/2817; H01J 2237/24564
USPC ................. 250/306, 307, 311, 310
See application file for complete search history.

(56) References Cited

U.S. PATENT DOCUMENTS

| | | | |
|---|---|---|---|
| 6,465,781 B1 * | 10/2002 | Nishimura | H01J 37/026 250/305 |
| 6,657,193 B2 | 12/2003 | Dan et al. | |
| 7,534,999 B2 | 5/2009 | Suzuki et al. | |
| 10,114,065 B2 | 10/2018 | Toshima | |
| 2003/0213893 A1 * | 11/2003 | Nagahama | H01J 37/28 250/210 |
| 2005/0045820 A1 | 3/2005 | Ohshima et al. | |
| 2006/0054813 A1 * | 3/2006 | Nokuo | G01N 23/225 250/307 |
| 2009/0244078 A1 * | 10/2009 | Kanai | H01J 37/20 345/533 |
| 2012/0235036 A1 * | 9/2012 | Hatakeyama | H01J 37/073 250/310 |
| 2014/0022431 A1 | 1/2014 | Chen et al. | |
| 2020/0363469 A1 | 11/2020 | Chen et al. | |

* cited by examiner

*Primary Examiner* — Jason L McCormack
(74) *Attorney, Agent, or Firm* — Viering Jentschura & Partner MBB

(57) ABSTRACT

According to various embodiments, an inspection device may include a chamber, a stage provided within the chamber, an electron emitter, a laser emitter, and a conductive probe. The stage may be configured to hold a sample. The electron emitter may be configured to emit an electron beam towards the stage, to generate a first electrical signal in the sample. The laser emitter may be configured to emit a laser beam towards the stage, to generate a second electrical signal in the sample. The conductive probe may be configured to receive from the conductive structure, at least one of the first electrical signal and the second electrical signal.

20 Claims, 2 Drawing Sheets

INSPECTION DEVICES AND METHODS OF INSPECTING A SAMPLE

TECHNICAL FIELD

Various embodiments relate to the inspection devices and methods of inspecting a sample, in particular, the inspection of semiconductor devices for defects.

BACKGROUND

Electron-beam-absorbed current (EBAC) is a semiconductor analysis technique that can be used to detect defects in semiconductor devices, in particular, in integrated circuits. EBAC involves using an electron beam to inject electrical charges into a semiconductor device. A portion of the electrical charges may be absorbed by the semiconductor device. EBAC involves measuring the current flow in the semiconductor device to generate an image based on the measured current. The electron beam may not be able to reach deep layers of the semiconductor device. As such, defects that are present in the deep layers of the semiconductor device may not be detectable using EBAC.

SUMMARY

According to various embodiments, an inspection device may include a chamber, a stage provided within the chamber, an electron emitter, a laser emitter, and a conductive probe. The stage may be configured to hold a sample. The electron emitter may be configured to emit an electron beam towards the stage, to generate a first electrical signal in the sample. The laser emitter may be configured to emit a laser beam towards the stage, to generate a second electrical signal in the sample. The conductive probe may be configured to receive from the conductive structure, at least one of the first electrical signal and the second electrical signal.

According to various embodiments, there may be provided a method for inspecting a sample. The method may include emitting an electron beam towards the sample, to generate a first electrical signal in the sample. The method may further include emitting a laser beam towards the sample, to generate a second electrical signal in the sample. The method may further include receiving at least one of the first electrical signal and the second electrical signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
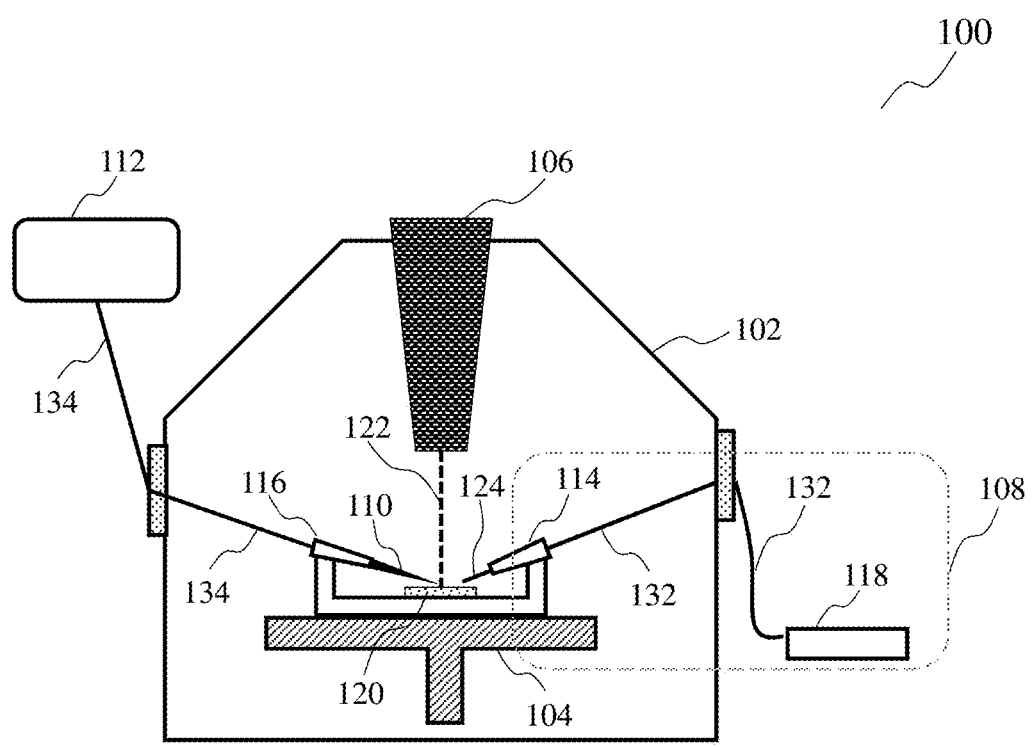
FIG. 1 shows a schematic diagram of an inspection device according to various non-limiting embodiments.

The embodiments generally relate to inspection devices for detecting or isolating faults in semiconductor devices. More particularly, some embodiments relate to an electron-beam induced current (EBIC) or EBAC device that utilizes laser beams to penetrate into the deep layers of the semiconductor device.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a schematic diagram of an inspection device 100 according to various non-limiting embodiments. The inspection device 100 may be configured to inspect a sample 120 for defects, in particular, to isolate a fault in a conductive structure 202 (not shown in FIG. 1) of the sample 120. The sample 120 may be a semiconductor device including, for example, silicon-on-insulator products.

The inspection device 100 may include a chamber 102. As an example, the chamber 102 may be a vacuum chamber. The inspection device 100 may further include a stage 104 provided in the chamber 102. The inspection device 100 may further include an electron emitter 106. The stage 104 may be structured to hold the sample 120. The sample 120 may be mounted, and may be electrically grounded, on the stage 104. The stage 104 may be movable, for example, along three orthogonal axes, to adjust the position of the sample 120 within the chamber 102. The stage 104 may be moved to position the sample 120 directly under the electron emitter 106.

The electron emitter 106 may be arranged to emit an electron beam 122 into the chamber 102, towards the stage 104. The electron emitter 106 may have an emitting end where the electron beam 122 exits. The electron emitter 106 may be arranged to have its emitting end face the stage 104. The electron beam 122 may be highly focused and the electron emitter 106 may scan the sample 120 in a raster pattern, so that the electron beam 122 may cover a target area of the sample 120. When the electron beam 122 irradiates the sample 120, at least part of the electron beam 122 may be absorbed in the sample 120. Absorption of the electron beam 122 in the sample 120 may trigger generation of electron-hole pairs in the sample 120. A first electrical current may flow through the conductive structure 202 of the sample 120 due to the electron-hole pairs, to provide a first electrical signal. The first electrical current may be referred to as electron beam-induced current.

Still referring to FIG. 1, the inspection device 100 may further include a laser emitter 108. The laser emitter 108 may be coupled to the chamber 102. The laser emitter 108 may be provided at least partially within the chamber 102. The laser emitter 108 may be arranged to emit a laser beam 124 into the chamber 102, towards the stage 104. The laser beam 124 may have an energy higher than the bandgap of the sample 120. For example, the laser beam 124 may be a 650 nm laser. The laser beam 124 may excite free electrons in an active region of the sample 120 to generate a photovoltaic effect on a specific area of the sample 120. Photons from the laser beam 124 may induce surface potential difference in the sample 120, causing a second electrical current to flow in the conductive structure 202 of the sample 120, to provide a second electrical signal.

The laser emitter 108 may include a laser source 118. The laser emitter 108 may optionally further include a laser guide 132. The laser guide 132 may include a fiber-optic adaptor. The laser source 118 may be provided outside of the chamber 102. The laser guide 132 may have an input end, and an output end opposite to the input end. The input end may be arranged outside the chamber 102, while the output end may be arranged inside the chamber 102. The input end may be coupled to the laser source 118 to receive the laser beam 124 from the laser source 118. The laser guide 132 may guide the received laser beam 124 from the input end to the output end. The output end may emit the laser beam 124 towards the stage 104. The laser beam 124 may be a broad beam that shines onto almost an entire area of the sample 120. In alternative embodiments, the laser beam 124 may be a focused beam and the laser emitter 108 may be configured to move the laser beam 124 to scan the sample 120 in a raster pattern.

The inspection device 100 may further include a laser manipulator 114 configured to manipulate the laser emitter 108 to point the laser beam 124 towards a specific area of the stage 104. The laser manipulator 114 may be coupled to the output end of the laser guide 132. The laser manipulator 114 may be configured to point the output end of the laser guide 132 at the sample 120. In an illustrative example, the laser manipulator 114 may be a piezo-controlled manipulator or other manipulator capable of focusing or positioning the laser beam 124 onto a specific area of the sample 120.

Still referring to FIG. 1, the inspection device 100 may further include a conductive probe 110. The conductive probe 110 may be connectable to the conductive structure 202 of the sample 120, to receive an electrical signal from the conductive structure 202.

The laser emitter 108 and the electron emitter 106 may be configured to emit their respective laser beam 124 and electron beam 122 to irradiate a common area of the sample 120 concurrently. When the photovoltaic effect takes place concurrently with the generation of electron-hole pairs in the sample 120, both the first electrical current and the second electrical current may flow in the conductive structure 202. The conductive probe 110 may pick up a combined electrical signal from the conductive structure 202. The combined electrical signal may include the first electrical signal and the second electrical signal. In other words, the conductive probe 110 may be configured to measure an electrical current running through the conductive structure 202 of the sample 120, and the electrical current may include at least part of the first electrical current and at least part of the second electrical current. The first and second electrical currents may flow in different depths or portions of the conductive structure 202. A high resistance region or open-circuit in the conductive structure 202, for example, as a result of a defect or a breakage in the conductive structure 202 may impede the flow of the first electrical current but not the second electrical current. As a result, the combined electrical signal received by the conductive probe 110 may provide information on the integrity of the conductive structure 202.

While the laser emitter 108 and the electron emitter 106 may be operated to emit their respective laser beam 124 and electron beam 122 concurrently, it may also be possible to operate only one of the laser emitter 108 and the electron emitter 106 at a time. When only the electron emitter 106 is operating, the conductive probe 110 may pick up only the first electrical signal. When only the laser emitter 108 is operating, the conductive probe 110 may pick up only the second electrical signal.

The inspection device 100 may optionally further include a probe manipulator 116 configured to position the conductive probe 110 to connect to the conductive structure 202. The probe manipulator 116 may be identical, or similar, to the laser manipulator 114, in its structure or mechanism.

The inspection device 100 may further include a current analyzer 112. The current analyzer 112 may be configured to process the combined electrical signal picked up by the conductive probe 110, to form an image of the conductive structure 202. A defect in the conductive structure 202 may be detected based on the image. The current analyzer 112 may be coupled to the conductive probe 110 by an electrical connector 134.

While FIG. 1 shows the laser manipulator 114 as being positioned within the chamber 102, in alternative embodiments, the laser emitter 108 may be controllable from outside of the chamber 102. In other alternative embodiments, the entire laser emitter 108 may be provided within the chamber 102.

According to various non-limiting embodiments, the inspection device 100 may include an EBAC device.

According to various non-limiting embodiments, the inspection device 100 may include components of a scanning electron microscope (SEM). For example, the electron emitter 106 may be a SEM column. The chamber 102 may be a SEM chamber. The stage 104 may be a SEM stage.

Figure 2:
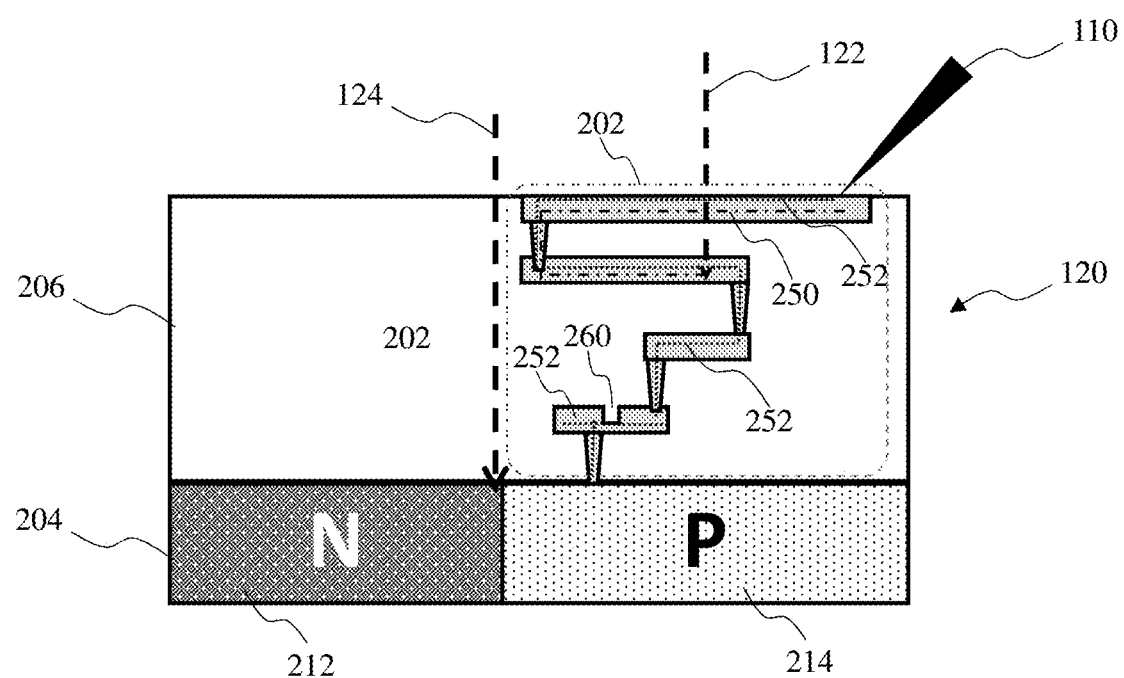
FIG. 2 shows a schematic cross-sectional diagram of a sample to illustrate the working principle of the inspection device.

FIG. 2 shows a schematic cross-sectional diagram of the sample 120 to illustrate the working principle of the inspection device 100. The sample 120 may include an active region 204 and an insulator region 206. The conductive structure 202 of the sample 120 may be disposed within the insulator region 206. The conductive structure 202 may include metal interconnects. The insulator region 206 may include mostly a dielectric material. The insulator region 206 may be an interlayer dielectric (ILD). As an example, the active region 204 may include an n-type region 212 and a p-type region 214, which may form a p-n diode.

During operation, both the laser emitter 108 and the electron emitter 106 may emit their respective laser beam 124 and electron beam 122 at the same area of the stage 104 such that both the laser beam 124 and the electron beam 122 irradiate a target area of the sample 120. A first electric current 250 may flow in the conductive structure 202, as a result of the conductive structure 202 absorbing energy from the electron beam 122 which triggers a release of electron-hole pairs. The first electric current 250 may be picked up by the conductive probe 110 as a first electrical signal. The laser beam 124 may induce a photovoltaic potential difference at the active region 204. As a result, a second electric current 252 may flow through the conductive structure 202. The second electric current 252 may be picked up by the conductive probe 110 as a second electrical signal.

The laser beam 124 may penetrate deeper into the sample 120 as compared to the electron beam 122. For example, as shown in FIG. 2, the electron beam 122 may only penetrate through one or two layers of the metal interconnects of the conductive structure 202 within the insulator region 206, whereas the laser beam 124 may penetrate through all layers of the metal interconnects and the active region 204 underlying the insulator region 206. For example, the electron beam 122 may only reach the back-end-of-line (BEOL) layer of the sample 120 while the laser beam 124 may reach the front-end-of-line (FEOL) layer of the sample 120.

The conductive probe 110 may be placed or moved along a surface of the sample 120 to contact part of the conductive structure 202, to measure the electric current in the conductive structure 202. As an example, the conductive structure 202 may have a defect 260 formed in a deep layer of the sample 120, such as a first or second layer of the metal interconnects. The first electric current 250 may flow to the upper layers of metal interconnects but may not flow to the deep layer where the defect 260 resides, and as such, the first electrical signal cannot provide information on the defect 260. On the other hand, the second electric current 252 may flow to the deep layer where the defect 260 resides, and as such, the second electrical signal may indicate a lack of current flow at the defect 260.

In addition to concurrently operating the electron emitter 106 and the laser emitter 108 to obtain a combination of the first and second electrical signals, the inspection device 100 may also operate the electron emitter 106 independently of the laser emitter 108 to obtain the first electrical signal for comparison with the combined electrical signal. The combined electrical signal may provide useful information for detecting or localizing a defect (for example, the defect 260) in the conductive structure 202.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An inspection device comprising:
   a chamber;
   a stage provided within the chamber, wherein the stage is configured to hold a sample;
   an electron emitter configured to emit an electron beam towards the stage, to generate a first electrical signal in the sample;
   a laser emitter configured to emit a laser beam towards the stage, to generate a second electrical signal in the sample;
   a conductive probe for connecting to a conductive structure of the sample, wherein the conductive probe is configured to receive from the conductive structure the first electrical signal and the second electrical signal; and
   a current analyzer configured to form an image of the conductive structure for inspection based on the first electrical signal and the second electrical signal received in the conductive probe.

2. The inspection device of claim 1, wherein the laser emitter is configured to emit the laser beam at a same area of the stage as the electron emitter and wherein the laser emitter is configured to emit the laser beam at a same time, as the electron emitter.

3. The inspection device of claim 1, wherein the electron emitter is configured to scan the sample in a raster pattern.

4. The inspection device of claim 1, wherein the chamber is a scanning electron microscope chamber.

5. The inspection device of claim 1, further comprising:
   a probe manipulator configured to position the conductive probe to connect the conductive structure.

6. The inspection device of claim 1, wherein the laser emitter comprises:
   a laser source configured to emit the laser beam; and
   a laser guide having an input end and an opposite output end, wherein the laser guide is configured to receive the laser beam from the laser source through the input end, and further configured to guide the received laser beam to the output end.

7. The inspection device of claim 6, further comprising:
   a laser manipulator configured to point the output end of the laser guide at a specific area of the stage.

8. The inspection device of claim 1, wherein the first electrical signal is an electron beam-induced current flowing in a first layer of the sample.

9. The inspection device of claim 8, wherein the second electrical signal is a current generated by photovoltaic effect flowing in a second layer of the sample, the second layer deeper than the first layer.

10. A method for inspecting a sample, the method comprising:
   emitting an electron beam towards the sample, to generate a first electrical signal in the sample;
   emitting a laser beam towards the sample, to generate a second electrical signal in the sample;
   receiving the first electrical signal and the second electrical signal from a conductive structure of the sample, using a conductive probe, and
   forming an image of the conductive structure for inspection based on the first electrical signal and the second electrical signal received in the conductive probe.

11. The method of claim 10, further comprising:
   detecting a defect in the conductive structure based on the image.

12. The method of claim 10, further comprising:
   emitting the laser beam at a same area of the sample, and at a same time, as the electron beam.

13. The method of claim 10, wherein emitting the electron beam comprises scanning the sample in a raster pattern with the electron beam.

14. The method of claim 10, further comprising:
   connecting the conductive probe to the conductive structure using a probe manipulator.

15. The method of claim 10, further comprising:
   pointing the laser emitter at a specific area of the stage using a laser manipulator.

16. The method of claim 10, wherein the first electrical signal is an electron beam-induced current flowing in a first layer of the sample.

17. The method of claim 16, wherein the second electrical signal is a current generated by photovoltaic effect flowing in a second layer of the sample, the second layer deeper than the first layer.

18. The inspection device of claim 1, wherein the electron beam is configured to reach a first depth in the sample and the laser beam is configured to reach a second depth in the sample and wherein the first depth is shallower than the second depth.

19. The inspection device of claim 18, wherein the electron beam is configured to reach a back-end-of-line (BEOL) layer of the sample and the laser beam is configured to reach a front-end-of-line (FEOL) layer of the sample.

20. The inspection device of claim 1, wherein the conductive probe is configured to receive from the conductive structure a combination of the first electrical signal and the second electrical signal; and the current analyzer is configured to form the image of the conductive structure for inspection based on the combination of the first electrical signal and the second electrical signal received in the conductive probe.

* * * * *